(12) United States Patent
Manno

(10) Patent No.: US 8,939,414 B2
(45) Date of Patent: Jan. 27, 2015

(54) BACKDROP FOR WALL-MOUNTED FLAT PANEL DISPLAY INSTALLATION AND METHOD

(76) Inventor: Anthony Richard Manno, Miami, FL (US)

( * ) Notice: Subject to any disclaimer, the term of this patent is extended or adjusted under 35 U.S.C. 154(b) by 263 days.

(21) Appl. No.: 13/361,226

(22) Filed: Jan. 30, 2012

(65) Prior Publication Data

US 2013/0194728 A1 Aug. 1, 2013

(51) Int. Cl.
*H05K 5/00* (2006.01)
*H05K 7/00* (2006.01)
*F16M 13/02* (2006.01)
*H05K 5/02* (2006.01)

(52) U.S. Cl.
CPC ............ *F16M 13/02* (2013.01); *H05K 5/0204* (2013.01); *Y10S 248/917* (2013.01)
USPC ........ 248/215; 248/339; 248/286.1; 248/917; 40/798

(58) Field of Classification Search
CPC ....... F16M 13/02; H05K 5/0204; H05K 5/00; H05K 7/00
USPC .............. 248/475.1, 489, 915, 917, 309, 235, 248/250, 214, 215, 317, 298.1, 286.1; 40/638, 700, 714, 745, 798, 299.01, 40/768, 799; 211/90.02, 103; D8/380; 361/679.01, 679.21, 679.22, 679.26
See application file for complete search history.

(56) References Cited

U.S. PATENT DOCUMENTS

| | | | | |
|---|---|---|---|---|
| 4,814,759 | A * | 3/1989 | Gombrich et al. ............... | 345/60 |
| 8,528,752 | B2 * | 9/2013 | Bowser et al. ............. | 211/90.02 |
| 2007/0164646 | A1 * | 7/2007 | Raab .......................... | 312/405.1 |
| 2008/0236015 | A1 * | 10/2008 | Fleming .......................... | 40/798 |
| 2010/0224751 | A1 * | 9/2010 | Hochhalter et al. .......... | 248/314 |
| 2010/0325929 | A1 * | 12/2010 | Favron ............................ | 40/638 |
| 2012/0037401 | A1 * | 2/2012 | Pastoriza et al. .............. | 174/135 |

* cited by examiner

*Primary Examiner* — Tan Le
(74) *Attorney, Agent, or Firm* — Kirschstein, et al.

(57) ABSTRACT

A flat panel display installation and method employ a wall bracket assembly for installing a flat panel display on, and at a spacing away from, a support wall. A background member is connected to the wall bracket assembly and is located behind the flat panel display in the spacing. The background member extends past an outer periphery of the flat panel display to be visible as an ornamental backdrop against which the flat panel display is viewable.

18 Claims, 3 Drawing Sheets

BACKDROP FOR WALL-MOUNTED FLAT PANEL DISPLAY INSTALLATION AND METHOD

FIELD OF THE DISCLOSURE

The present disclosure relates generally to a wall-mounted, flat panel display installation and method and, more particularly, to an ornamental backdrop or background against which the flat panel display, such as a television, is visible to provide a decorative and aesthetic appearance to the installation.

BACKGROUND

Flat panel displays, such as LCD and plasma screen televisions, have increased in popularity as an alternative to cathode ray tube televisions. Due to the decreased thickness (front-to-back dimension) or depths of such televisions, many are no longer mounted in cabinets, or placed on shelves or on television stands, but are mounted on room walls for television viewing. A wall bracket assembly is typically affixed to a wall, and a television is mounted on the bracket assembly. Such televisions typically have chassis with metal or plastic borders surrounding their television screens, but such borders do not necessarily fit in or blend with the decor of the rooms in which they are installed. Whether the installed televisions are turned on or off, they are focal points of the rooms in which they are installed, especially as the sizes of their television screens increase, e.g., from thirteen to over seventy inches as measured along the diagonal. As a result of their increasing size and their borders, many such wall-mounted television installations are not aesthetically pleasing.

To improve the decorative aspect of the television installation, it is known to attach a frame directly on the television around its screen in a manner resembling a painting. However, each frame must be custom made for, and fitted to the size of, each television. Even televisions of the same screen size may have different outer peripheral border dimensions to be accommodated by the frame. Customized frames are not only expensive to make and install, with concomitant delays for each frame to be built, but also many televisions do not readily permit a frame to be directly attached thereto. In some cases, the integrity of the television chassis must be compromised.

It is also known to place an ornamental cover over a television screen, which cover may be removed when the television is turned on or being viewed. However, these known ornamental covers use complex or complicated mechanical systems to control their removal from, and placement over, the television screen. These covers are expensive, and the mechanical systems can be unseemly when the televisions are in use.

Accordingly, there remains a need to install and maintain flat screen televisions in a decoratively and aesthetically pleasing way to complement the decor of the rooms in which they are installed, without using complicated, bulky or expensive mechanical systems or components, and without affixing frames or any custom-made components directly to the televisions.

BRIEF DESCRIPTION OF THE FIGURES

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
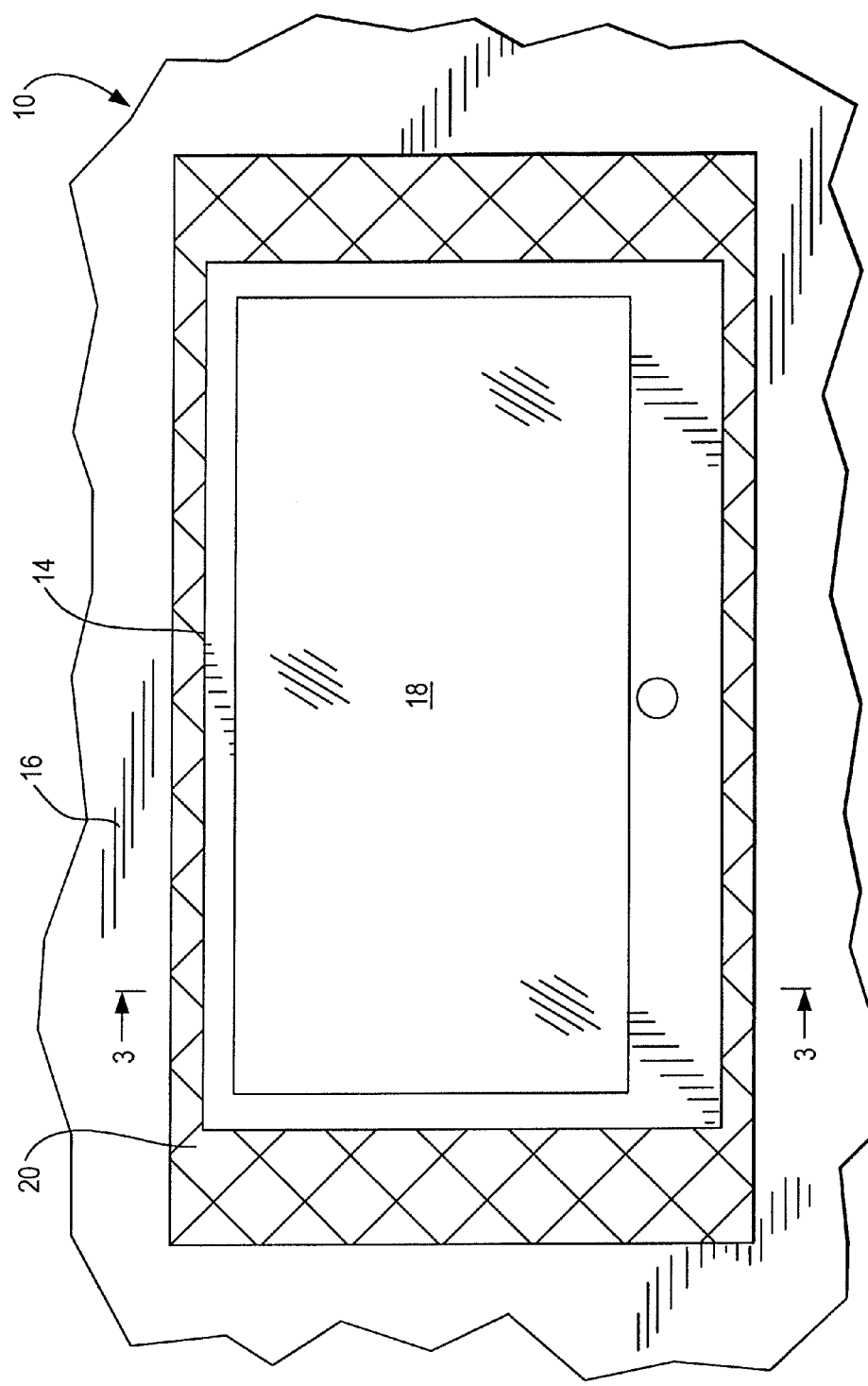
FIG. 1 is a front elevational view of a wall-mounted, flat panel display installation with an ornamental backdrop in accordance with this invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

A flat panel display installation, in accordance with one feature of this invention, includes a wall bracket assembly for installing a flat panel display, e.g., a television, a tablet computer, and like electronic devices having displays, on, and at a spacing away from, a support wall; and a background member, e.g., a generally rectangular panel, preferably constituted of a rigid material, such as wood, metal, plastic, glass, heavy-duty paper, or cork, and preferably having a decorative surface finish, connected to the wall bracket assembly and located behind the flat panel display in the spacing. The background member is spaced from, and unconnected to, the flat panel display. The background member extends past an outer periphery of the flat panel display to be visible as an ornamental backdrop against which the flat panel display is viewable.

Preferably, the flat panel display is likewise generally rectangular and has upper, lower, right and left sides. The area of the generally rectangular panel is greater than the area of the generally rectangular display. Advantageously, the generally rectangular panel extends beyond at least one, and preferably at least two, e.g., either the upper and lower sides, or the right and left sides, and more preferably all, of the sides of the flat panel display.

In one embodiment, the wall bracket assembly includes a main bracket extending along a longitudinal direction, and a pair of flanges located at opposite end regions of the main bracket and extending in mutual parallelism in a transverse direction generally perpendicular to the longitudinal direction. The flanges have apertures and contact the background member at spaced-apart locations. A plurality of fasteners extends through the apertures into the background member for securing and holding the background member to the flanges at said locations. The background member has a plurality of inner walls bounding a cutout across which the main bracket extends. The flanges contact, and are connected to, two of the inner walls of the background member.

In a preferred embodiment, the background member is adjustably mounted and shiftable relative to the flat panel display. The background member has a plurality of fastener locations, and each aforementioned fastener extends through a respective aperture in a respective flange into a selected one of the plurality of fastener locations for adjustably securing and holding the background member to the flanges at said selected fastener locations.

Turning now to the drawings, reference numeral 10 generally identifies a flat panel display installation, which includes a wall bracket assembly 12 (see FIG. 2) for installing a flat panel display, e.g., a television 14, on, and at a spacing away from, a support wall 16 of a room. The television 14 has a screen 18, which can be of various sizes, e.g., from thirteen to over seventy inches as measured along the diagonal. A background member 20, e.g., a generally rectangular panel, preferably constituted of a rigid or semi-rigid material, such as wood, metal, plastic, glass, heavy-duty paper, or cork and like materials, and preferably having a decorative outer surface finish, is connected to the wall bracket assembly 12 and, as best seen in FIG. 3, is located behind the television 14. The background member 20 is advantageously in close proximity, or in contact with, the wall 16, and is spaced, e.g., less than one to five inches, away from, and not directly connected to, the television 14. The background member 20 extends past an outer periphery of the television 14 to be visible as an ornamental backdrop against which the television 14 is viewable.

The television 14 is likewise generally rectangular in shape and has upper, lower, right and left sides. The area of the generally rectangular background member 20 along the horizontal and vertical directions is greater than the corresponding area of the generally rectangular television 14. Advantageously, the generally rectangular background member 20 extends beyond at least one, and preferably at least two, e.g., either the upper and lower sides, or the right and left sides, and more preferably all, of the sides of the television 14. Thus, as shown in FIG. 1, the background member 20 extends beyond the outer periphery of the television 14 and "frames" the latter and ornaments the installation 10 by virtue of its decorative outer surface finish. The extent of the background member 20 past the television 14 may or may not be equal along the horizontal and vertical directions, and may or may not be equal past the sides of the television 14. If the background member 20 is a wooden panel, then the grain of the wood could serve as its decorative outer surface finish. The decorative outer surface finish could also be a coating of paint, a stencil, or virtually any graphic, that is directly applied to the background member 20, or a patterned or unpatterned fabric or the like that covers the background member 20.

Figure 2:
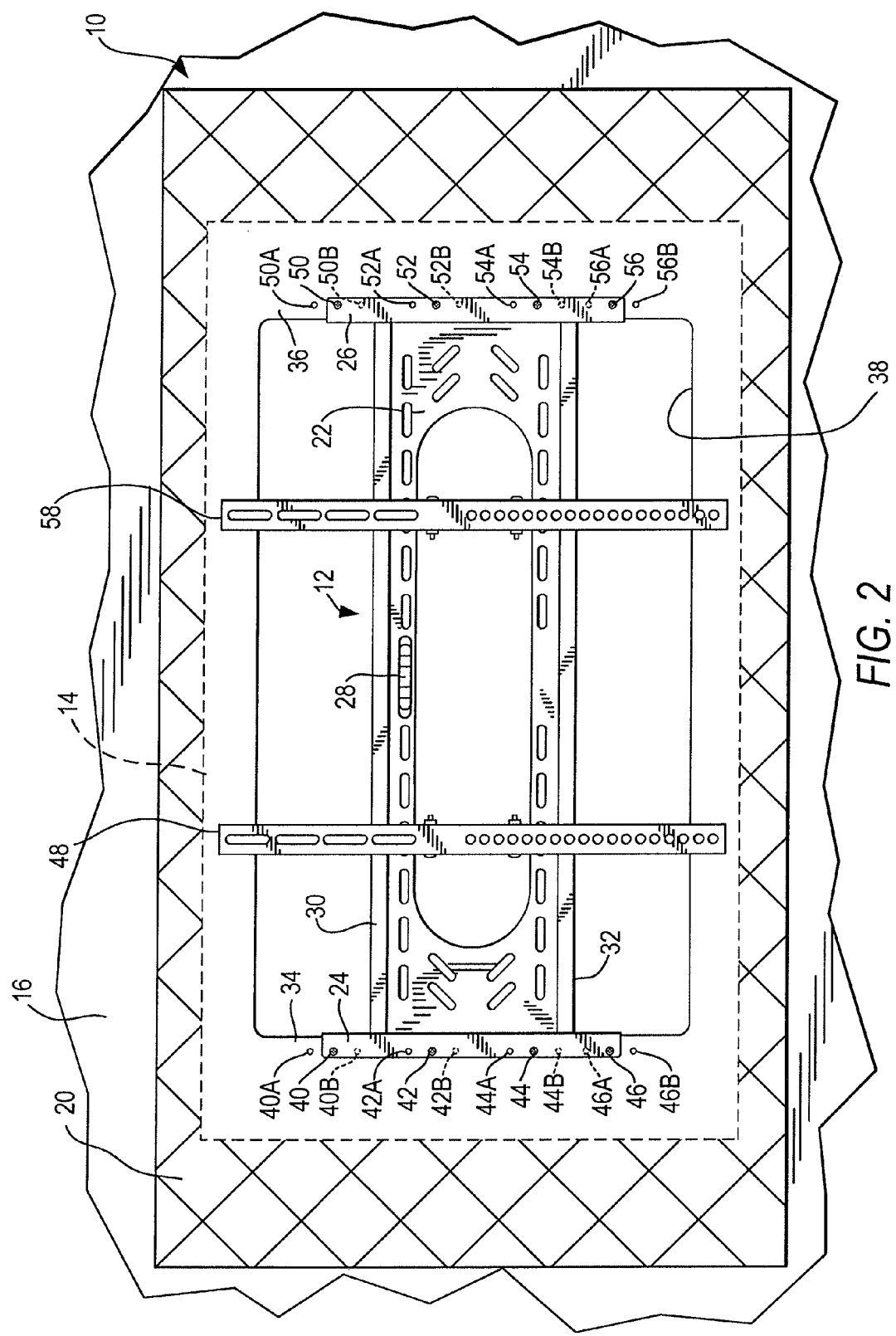
FIG. 2 is a view analogous to FIG. 1, but with the flat panel display shown in broken lines.
Figure 3:
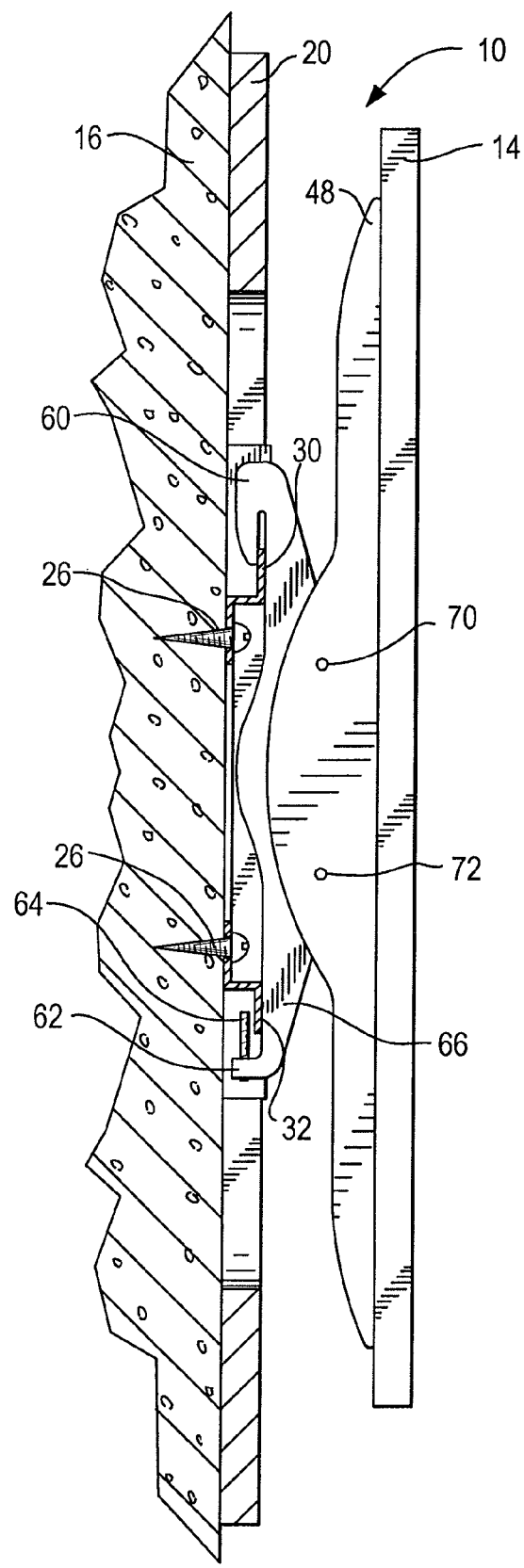
FIG. 3 is a side sectional view taken on line 3-3 of FIG. 1.

As shown in FIG. 2, the wall bracket assembly 12 includes a main bracket 22 extending horizontally along a longitudinal direction, and a pair of upright end flanges 24, 26 located at opposite end regions of the main bracket 22 and extending in mutual parallelism in a transverse vertical direction generally perpendicular to the horizontal direction. The main bracket 22 is secured to the wall by screws or wall anchors 26. A bubble level 28 (see FIG. 2) insures that the main bracket 22 is positioned horizontally to the floor during installation. The main bracket 22 has an upper suspension rail 30 from which the television 14 is suspended, and a lower mounting rail 32 for securing the suspended television 14, as described below. The rails 30, 32 are mutually parallel along the horizontal direction.

The background member 20 has a plurality of inner walls 34, 36 bounding a cutout 38 across which the main bracket 22 extends. The main bracket 22 is at least partially received in the cutout 38. Advantageously, the cutout 38 accommodates any wiring or cables (not illustrated) connected to, and routed behind, the television 14. The flanges 24, 26 contact the inner walls 34, 36 of the background member, and have a plurality of apertures arranged along their lengths. A first plurality of fasteners 40, 42, 44, 46 extends through the apertures in the flange 24 into the inner wall 34 of the background member 20. A second plurality of fasteners 50, 52, 54, 56 extends through the apertures in the flange 26 into the inner wall 36 of the background member 20. If the background member 20 is a wooden panel, then the fasteners 40, 42, 44, 46, 50, 52, 54, 56 are advantageously screws that self-tap into the inner walls 34, 36 at the illustrated eight spaced-apart locations. The number of fasteners and corresponding spaced-apart locations need not be eight as illustrated, but could be a different number. Also, fasteners, other than screws, such as bolts, could be employed. Thus, the background member 20 is securely connected, and held, to the flanges 24, 26 at said plurality of locations.

The wall bracket assembly 12 includes at least one upright, and preferably a pair of uprights 48, 58, mounted on, and rearwardly of, the television 14. As illustrated in FIG. 2, each upright has a plurality of slots and openings to facilitate the mounting and direct attachment of the uprights 48, 58 on the back of the television 14. Each upright 48, 58 has a tilting member 66 pivotable about transverse pins 70, 72. Each tilting member 66 has a hook 60 (see FIG. 3) for suspending the television 14 from the upper rail 30, and a lug 62, together with a threaded post 64, that lockingly engage the lower rail 32.

In use, the television 14 is installed on the support wall 16 by connecting the background member 20 to the main bracket 22 by means of the fasteners 40, 42, 44, 46, 50, 52, 54, 56, and then by mounting the main bracket 22 and the connected background member 20 to the support wall 16 by means of the wall anchors 26. Either previously or subsequently, the uprights 48, 58 are attached on the back of the television 14. The television 14 and its attached uprights 48, 50 are then mounted on the wall-mounted bracket assembly 12 by hooking each hook 60 on the upper rail 30 and by lockingly engaging the lower rail 32 with each lug 62 and threaded post 64. The television 14 is thus positioned in front of the background member 20 and at a spacing away from the support wall 16. As discussed above, the background member 20 is configured and sized to extend past an outer periphery of the television 14 to be visible as an ornamental backdrop against which the television 14 is viewable.

In a preferred embodiment, the background member 20 is adjustably mounted and shiftable relative to the television 14. The background member 20 has a plurality of higher fastener locations 40A, 42A, 44A, 46A, 50A, 52A, 54A, 56A, and another plurality of lower fastener locations 40B, 42B, 44B, 46B, 50B, 52B, 54B, 56B. Each of the aforementioned fasteners 40, 42, 44, 46, 50, 52, 54, 56 extends through a respective aperture in a respective flange 24, 26 into the higher fastener locations 40A, 42A, 44A, 46A, 50A, 52A, 54A, 56A, as a group, for shifting the background member 20 relative to the television 14 to a lower elevation, or into the lower fastener locations 40B, 42B, 44B, 46B, 50B, 52B, 54B, 56B, as a group, for shifting the background member 20 relative to the television 14 to a higher elevation. Such up-and-down vertical adjustment may be desired to center the television 14 against the background member 20. Each said higher and lower fastener location may be a pre-drilled hole, or a hole formed by the self-tapping screws 40, 42, 44, 46, 50, 52, 54, 56.

Other means for adjustably mounting and shifting the background member 20 relative to the television 14 are contemplated by this invention. For example, the apertures in the flanges 24, 26 may be vertically elongated slots. The apertures in the flanges 24, 26 may also be horizontally elongated to enable side-to-side horizontal adjustment. A series of pre-drilled holes may also be formed in the background member

20, and adjustment may be achieved by using pegs that are inserted into a selected one of the pre-drilled holes.

Other wall bracket assemblies are also contemplated by this invention. For example, a wall bracket assembly may comprise a pair of spaced-apart discs affixed to the support wall 16, and a wire strung between the discs. A flat panel display could then be suspended from the wire. As another example, a wall bracket assembly may comprise at least one corner bracket from which an arm extends to support the flat panel display.

Due to the large range of television screen sizes, e.g., from thirteen to over seventy inches as measured along the diagonal, it is contemplated to provide the background member in, for example, three sizes. A small size would be targeted for small screen sizes in a range on the order of thirteen to forty-two inches; a medium size would be targeted for medium screen sizes in a range on the order of forty-two inches to sixty inches; and a large size would be targeted for large screen sizes in a range on the order of sixty inches and greater.

It is particularly desirable if the background member is connected in advance to the wall bracket assembly prior to shipment to a consumer. Thus, the consumer or installer need not be bothered with connecting the background member to the wall bracket assembly in situ at the support wall. This greatly facilitates installation. Although it is preferred if the background member is generally rectangular, other shapes are also contemplated.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings For example, the flanges 24, 26 need not be upright end flanges that are located at opposite end regions of the main bracket 22, but could be top and bottom flanges that are located at upper and lower regions of the main bracket 22 and extending in mutual parallelism along the horizontal direction.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has," "having," "includes," "including," "contains," "containing," or any other variation thereof, are intended to cover a non-exclusive inclusion, such that a process, method, article, or apparatus that comprises, has, includes, or contains a list of elements does not include only those elements, but may include other elements not expressly listed or inherent to such process, method, article, or apparatus. An element proceeded by "comprises . . . a," "has . . . a," "includes . . . a," or "contains . . . a," does not, without more constraints, preclude the existence of additional identical elements in the process, method, article, or apparatus that comprises, has, includes, or contains the element. The terms "a" and "an" are defined as one or more unless explicitly stated otherwise herein. The terms "substantially," "essentially," "approximately," "about," or any other version thereof, are defined as being close to as understood by one of ordinary skill in the art, and in one non-limiting embodiment the term is defined to be within 10%, in another embodiment within 5%, in another embodiment within 1%, and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

The invention claimed is:

1. A flat panel display installation, comprising:
a wall bracket assembly for installing a flat panel display on, and at a spacing away from, a support wall, the wall bracket assembly including a suspension rail, and at least one upright mounted on, and rearwardly of, the flat panel display, the upright having a hook for suspending the flat panel display from the rail; and
a background member connected to the wall bracket assembly and located rearwardly behind the flat panel display in the spacing between the flat panel display and the support wall, the background member extending past an outer periphery of the flat panel display to be visible as an ornamental backdrop against which the flat panel display is viewable.

2. The installation of claim 1, wherein the background member is a generally rectangular panel having an area that is greater than an area of the flat panel display.

3. The installation of claim 1, wherein the flat panel display has upper, lower, right and left sides, and wherein the background member extends beyond at least one of the sides of the flat panel display.

4. The installation of claim 1, wherein the background member has an outer surface facing away from the wall, and wherein the outer surface has a decorative finish.

5. The installation of claim 1, wherein the wall bracket assembly includes a pair of flanges having apertures and contacting the background member at spaced-apart locations, and a plurality of fasteners extending through the apertures into the background member for securing and holding the background member to the flanges at said locations.

6. The installation of claim 5, wherein the wall bracket assembly includes a main bracket extending along a longitudinal direction, and wherein the flanges are located at opposite end regions of the main bracket and extend in mutual parallelism in a transverse direction generally perpendicular to the longitudinal direction.

7. The installation of claim 6, wherein the background member has a plurality of inner walls bounding a cutout across which the bracket extends, and wherein the flanges contact, and are connected to, two of the inner walls of the background member.

8. The installation of claim 1, wherein the background member is rearwardly spaced from, and unconnected to, the flat panel display.

9. The installation of claim 1, wherein the background member is adjustably mounted and shiftable relative to the flat panel display.

10. The installation of claim 9, wherein the background member has a plurality of fastener locations; and wherein the wall bracket assembly includes a pair of flanges having apertures, and a plurality of fasteners, each fastener extending through a respective aperture into a selected one of the fastener locations for adjustably securing and holding the background member to the flanges at said selected fastener locations.

11. The installation of claim 1, wherein the background member is constituted of one of wood, metal, plastic, glass, heavy-duty paper, and cork.

12. The installation of claim 1, wherein the background member is sized to accommodate a range of sizes of the flat panel display.

13. The installation of claim 1, wherein the flat panel display is a television.

14. A method of installing a flat panel display on a support wall, comprising:
    connecting a background member to a wall bracket assembly that includes a suspension rail, and at least one upright having a hook;
    mounting the wall bracket assembly and the connected background member to the support wall;
    mounting the flat panel display on the wall bracket assembly, in front of the background member and at a spacing away from the support wall, by mounting the upright on, and rearwardly of, the flat panel display, and by suspending the flat panel display from the rail with the hook; and
    configuring the background member located rearwardly behind the flat panel display in the spacing between the flat panel display and the support wall to extend past an outer periphery of the flat panel display to be visible as an ornamental backdrop against which the flat panel display is viewable.

15. The method of claim 14, and adjustably mounting and shifting the background member relative to the flat panel display.

16. The method of claim 14, wherein the background member is connected to the wall bracket assembly in advance of arrival and installation at the support wall.

17. The method of claim 14, and spacing the background member rearwardly away from, and unconnected to, the flat panel display.

18. The method of claim 14, and configuring the background member with an outer surface facing away from the support wall, and ornamenting the outer surface with a decorative finish.

* * * * *